US012764915B2

(12) United States Patent
Wang et al.

(10) Patent No.: US 12,764,915 B2
(45) Date of Patent: Oct. 13, 2026

(54) POWER SUPPLY DEVICE

(71) Applicant: 3Y POWER TECHNOLOGY (TAIWAN) INC., Taoyuan City (TW)

(72) Inventors: Chuan-Kai Wang, Taoyuan City (TW); Shao-Feng Lu, Taoyuan City (TW)

(73) Assignee: 3Y POWER TECHNOLOGY (TAIWAN) INC., Taoyuan City (TW)

( * ) Notice: Subject to any disclaimer, the term of this patent is extended or adjusted under 35 U.S.C. 154(b) by 256 days.

(21) Appl. No.: 18/648,955

(22) Filed: Apr. 29, 2024

(65) Prior Publication Data

US 2024/0397677 A1 Nov. 28, 2024

Related U.S. Application Data

(60) Provisional application No. 63/468,249, filed on May 22, 2023.

(51) Int. Cl.

| | |
|---|---|
| ***H05K 7/20*** | (2006.01) |
| ***H02M 3/00*** | (2006.01) |
| ***H05K 7/14*** | (2006.01) |

(52) U.S. Cl.
CPC ........ *H05K 7/20909* (2013.01); *H02M 3/003* (2021.05); *H05K 7/14* (2013.01)

(58) Field of Classification Search
CPC ...... H05K 7/20909; H05K 7/14; H02M 3/003
USPC .......................................................... 361/733
See application file for complete search history.

(56) References Cited

U.S. PATENT DOCUMENTS

| | | | | |
|---|---|---|---|---|
| 5,761,045 A * | 6/1998 | Olson | G06F 1/189 | 361/728 |
| 6,005,773 A * | 12/1999 | Rozman | H05K 7/209 | 363/141 |
| 9,451,721 B1 * | 9/2016 | Shih | H05K 7/1457 | |
| 2001/0010619 A1 * | 8/2001 | Manweiler | G06F 1/181 | 361/679.02 |
| 2006/0087872 A1 * | 4/2006 | Barsun | G06F 1/26 | 363/146 |
| 2012/0270417 A1 * | 10/2012 | Lorentzen | G06F 13/4072 | 439/55 |
| 2013/0134786 A1 * | 5/2013 | Ishigaki | H02M 3/158 | 307/71 |
| 2015/0042228 A1 * | 2/2015 | Hiramatu | H05B 45/3725 | 315/112 |
| 2017/0139451 A1 * | 5/2017 | Chuang | H05K 7/1427 | |
| 2017/0285696 A1 * | 10/2017 | Magnusson | G06F 1/183 | |

FOREIGN PATENT DOCUMENTS

TW M445326 U * 1/2013

* cited by examiner

*Primary Examiner* — Zhengfu J Feng
(74) *Attorney, Agent, or Firm* — MUNCY, GEISSLER, OLDS & LOWE, P.C.

(57) ABSTRACT

A power supply device is installed inside a casing having an accommodation space. The power supply device includes at least two power supplies. The at least two power supplies are disposed in the accommodation space, and at least one of the at least two power supplies is an open-frame power supply. Each of the at least two power supplies includes a connection unit, and the at least two power supplies are connected in series through the connection units.

14 Claims, 6 Drawing Sheets

POWER SUPPLY DEVICE

CROSS-REFERENCE TO RELATED APPLICATION

This patent application claims the benefit of U.S. Provisional Patent Application No. 63/468,249, filed May 22, 2023, which is incorporated by reference herein.

BACKGROUND

Technical Field

The present disclosure relates to a power supply device, and more particularly to power supply device having at least one open-frame power supply.

Description of Related Art

The statements in this section merely provide background information related to the present disclosure and do not necessarily constitute prior art.

The server host module configuration of existing networking communication systems usually has a redundant power supply module and a cooling fan installed at an input terminal of the host module. In particular, the structure of the redundant power supply module is that at least two enclosure power supplies are connected in parallel. If the structure has a dual redundancy mechanism, any one of the at least two enclosure power supplies can be replaced once it is damaged, and a cold/hot swap is supported. The two power supplies can achieve current sharing through a current-sharing bus and a controller. However, the enclosure power supply must have all circuit components and a casing, which is costly and cannot meet market demand.

The commonly used power supply configuration in the industry is shown in FIG. 6. In general, two enclosure power supplies 1*a*, 2*a* are configured in the accommodation space of the system cabinet and are connected in left and right (vertical) parallel to achieve power supply by generating two output voltages Vout1, Vout2.

However, such a power space is not easy to solve the heat dissipation problem and the cost increases due to over-design. In addition, problems such as back pressure and thermal eddy currents are prone to occur between the power supply and the system.

Therefore, how to design a power supply device to solve the problems and technical bottlenecks in the existing technology has become a critical topic in this field.

SUMMARY

An objective of the present disclosure is to provide a power supply device, and the power supply device is installed inside a casing having an accommodation space. The power supply device includes at least two power supplies. The at least two power supplies are disposed inside the accommodation space, and at least one of the two at least two power supplies is an open-frame power supply. Each of the at least two power supplies includes a connection unit, and the two at least two power supplies are connected in series through the connection units.

In one embodiment, the accommodation space includes a power space and a system space. The at least two power supplies are laterally disposed inside the power space. The at least one open-frame power supply is disposed away from a first opening of the power space.

In one embodiment, the power supply device further includes a tray. The tray carries the at least two power supplies thereon. The tray includes a handle, and the handle pushes and pulls the tray in the accommodation space so as to replace any one of the at least two power supplies.

In one embodiment, the tray further includes at least one partition, and the at least one partition is disposed on one side of the tray. The at least one partition includes an opening, and the size of the opening is adjustable.

In one embodiment, the power supply device further includes a partition, and the partition is longitudinally disposed between the power space and the system space. The partition includes an opening, and the size of the opening is adjustable.

In one embodiment, the power supply device further includes a first cooling fan, and the first cooling fan is laterally disposed in the first opening of the power space.

In one embodiment, the power supply device further includes a second cooling fan, and the second cooling fan is laterally disposed in a second opening of the system space.

In one embodiment, the connection unit is a gold finger connector or a wire-to-board connector.

In one embodiment, one of the at least two power supplies includes a DC-to-DC conversion unit, and the DC-to-DC conversion unit converts an external voltage to generate a DC supply voltage to a system.

In one embodiment, the DC-to-DC conversion unit is disposed on the open-frame power supply.

In one embodiment, the DC supply voltage is one of 12 volts, 9 volts, 5 volts, and 3.3 volts.

In one embodiment, one of the at least two power supplies includes a current-sharing controller, and the current-sharing controller realizes an output current-sharing control of the at least two power supplies through a proportional current sharing.

In one embodiment, one of the at least two power supplies includes a common-mode filter, and the common-mode filter is shared by the at least two power supplies.

In one embodiment, the common-mode filter is disposed in one of the at least one power supply.

Accordingly, the power supply device proposed by the present disclosure has the following characteristics and advantages: 1. the power supply close to the system is set as an open-frame power supply and designed as a series-connected structure, which can save the use of connectors on the system side; 2. due to the series-connected structure design, the two power supplies can share one common-mode filter to save cost and space; 3. due to the series-connected structure design, the system side can save the required additional filter circuit and space so that the extra space can be used to increase the power of the open-frame power supply; 4. due to the series-connected structure design, the active current-sharing control circuit can be omitted; 5. by adjusting the size of the opening(s) of the partition, the airflow in the power space and the system space can be effectively managed to achieve the optimal cooling efficiency.

It is to be understood that both the foregoing general description and the following detailed description are exemplary, and are intended to provide further explanation of the present disclosure as claimed. Other advantages and features of the present disclosure will be apparent from the following description, drawings, and claims.

BRIEF DESCRIPTION OF DRAWINGS

The present disclosure can be more fully understood by reading the following detailed description of the embodiment, with reference made to the accompanying drawing as follows.

DETAILED DESCRIPTION

Figure 1:
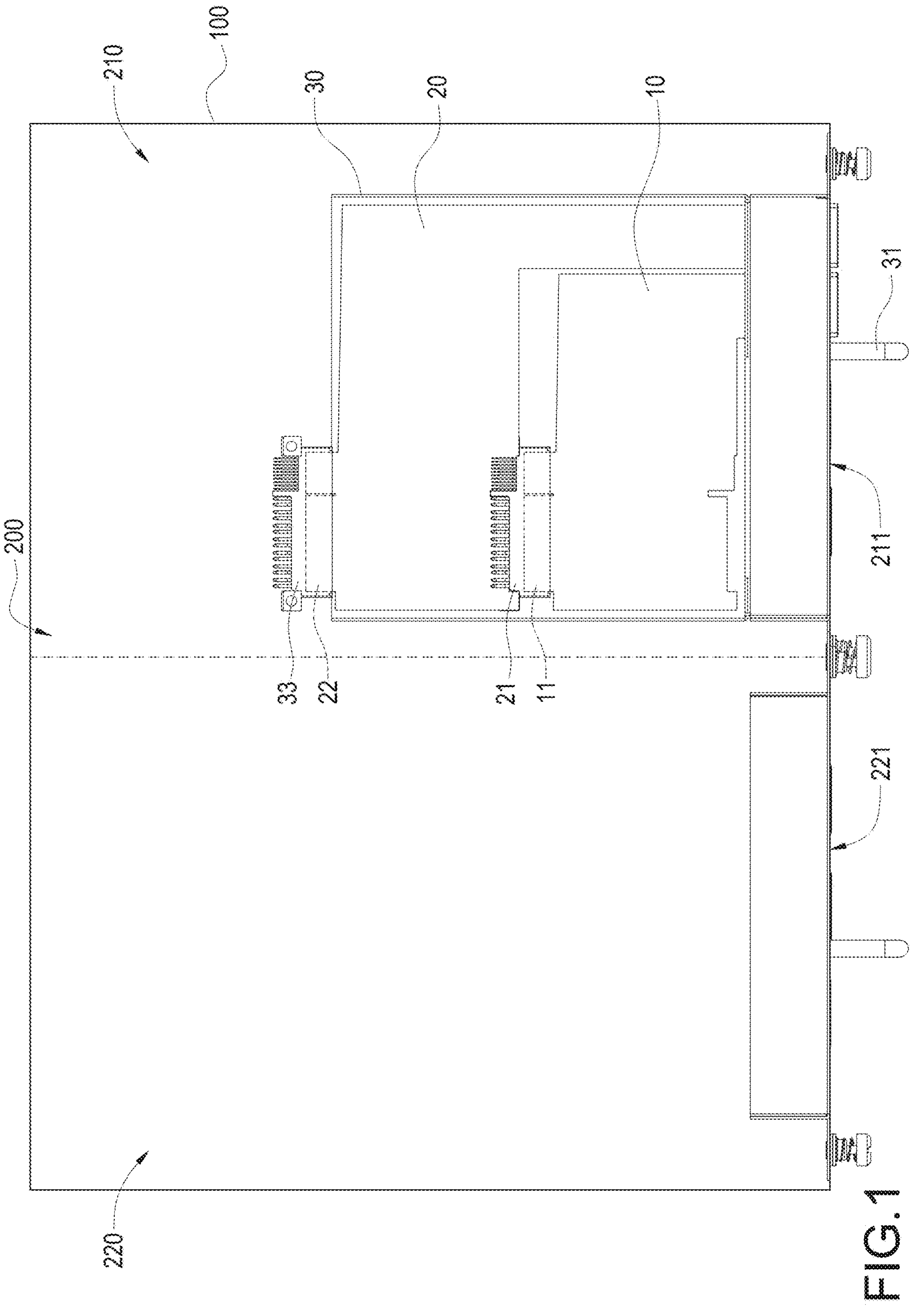
FIG. 1 is a top view of a power supply device according to a first embodiment of the present disclosure.

Reference will now be made to the drawing figures to describe the present disclosure in detail. It will be understood that the drawing figures and exemplified embodiments of present disclosure are not limited to the details thereof.

The implementation of the present disclosure is described below through specific examples, and those who are familiar with this technology can easily understand other advantages and effects of the present disclosure from the content disclosed in this specification.

The present disclosure can also be implemented or applied through other different specific examples, and the details in the present disclosure can also be modified and changed based on different viewpoints and applications without departing from the spirit of the present disclosure.

The structures, proportions, sizes, and number of components shown in the drawings attached to the present disclosure are only used to match the content in the present disclosure, for those who are familiar with this technology to understand and read, and are not used to limit the implementation of the present disclosure. Any modification of structure, change of proportional relationship or adjustment of size shall fall within the scope covered by the technical content disclosed in the present disclosure, provided that it does not affect the effect and purpose of the present disclosure.

Figure 2:
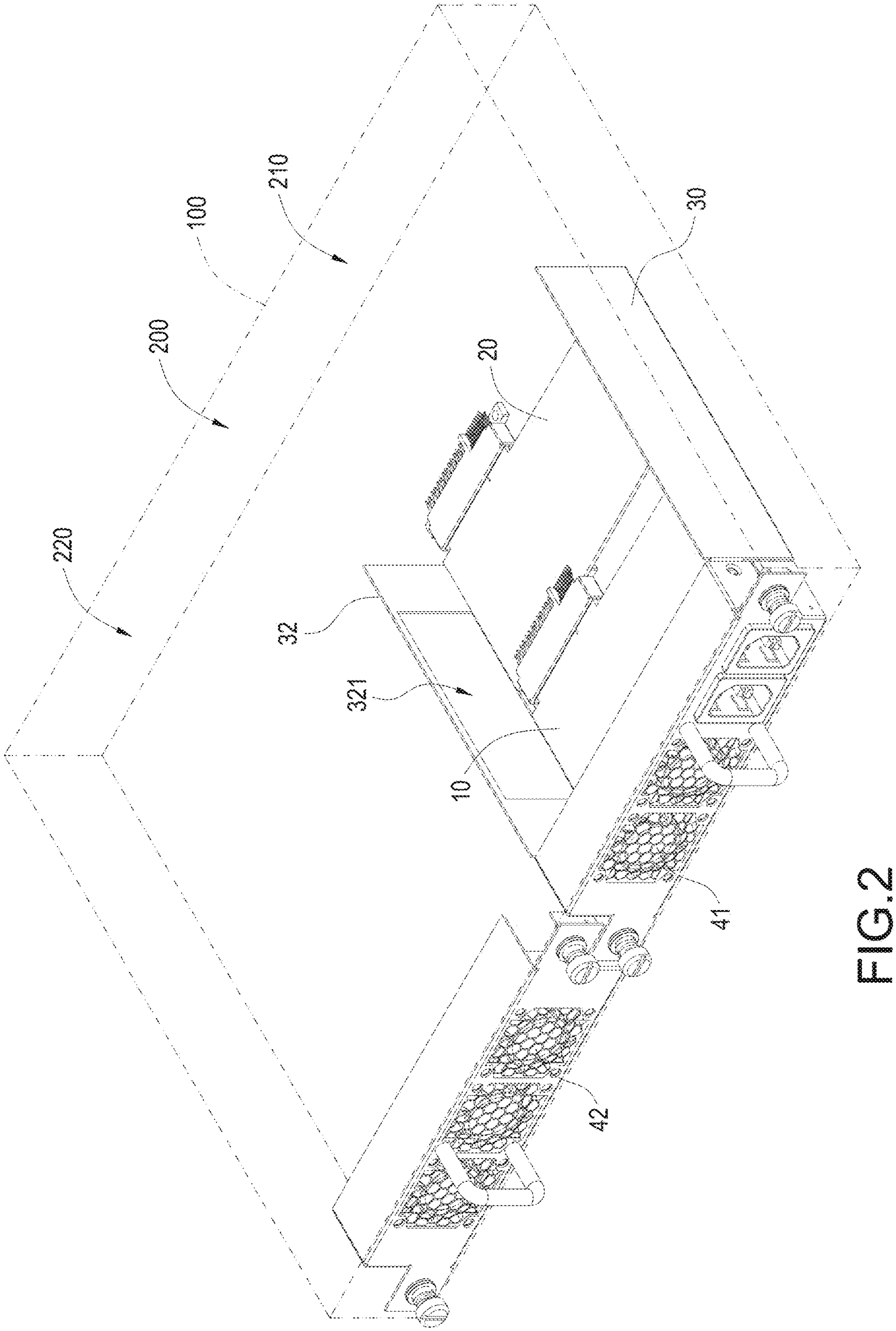
FIG. 2 is a perspective view of the power supply device according to the first embodiment of the present disclosure.

Please refer to FIG. 1 and FIG. 2, which respectively show a top view and a perspective view of a power supply device according to a first embodiment of the present disclosure. The power supply device is disposed inside a casing 100, and the casing 100 provides an accommodation space 200, that is, the power supply device is disposed inside the accommodation space 200.

The power supply device includes at least two power supplies 10, 20. Taking the two power supplies 10, 20 shown in embodiments of FIG. 1 and FIG. 2 as an example, that is, a first power supply 10 and a second power supply 20. The at least two power supplies 10, 20 are disposed inside the accommodation space 200, and at least one of the two power supplies 10, 20 is an open-frame power supply. In other words, in one embodiment, one of the first power supply 10 and the second power supply 20 is the open-frame power supply, or two of the first power supply 10 and the second power supply 20 are both open-frame power supplies. Compared with the structure of the open-frame power supply, there is also a structure of an enclosure power supply. Therefore, in the embodiment of the present disclosure, there is no operation mode in which all power supplies are enclosure power supplies.

As shown in FIG. 1 and FIG. 2, one of the at least two power supplies 10, 20 includes a connection unit 11, 21, that is, the first power supply 10 includes a first connection unit 11, and the second power supply 20 includes a second connection unit 21. In particular, the connection unit 11, 21 is, for example, but not limited to, a gold finger connector or a wire-to-board connector. Any connector with electrical connection function can be used as the connection unit 11, 21 of the present disclosure. Therefore, the at least two power supplies 10, 20 are connected in series to each other through the connection units 11, 21. For example, the first power supply 10 is connected to the second power supply 20 to each other by connecting the first connection unit 21 (for example, the gold finger connector or the wire-to-board connector) to the second connection unit 21 (for example, the gold finger connector or the wire-to-board connector correspondingly). In particular, the output terminal of the second power supply 20 further includes a third connection unit 22. The second power supply 20 is electrically connected to the system side by connecting the third connection unit 22 (for example, the gold finger connector or the wire-to-board connector) to a fourth connection unit 33 (for example, the gold finger connector or the wire-to-board connector correspondingly) disposed on the system side.

As shown in FIG. 1 and FIG. 2, the accommodation space 200 of the casing 100 at least includes a power space 210 and a system space 220. In particular, the at least two power supplies 10, 20 are laterally disposed inside the power space 210. Incidentally, different from the power supplies in the prior art that are vertically arranged side by side, the first power supply 10 and the second power supply 20 of the present disclosure are laterally disposed side by side in the power space 210. In addition, the accommodation space 200 includes the power space 210 and the system space 220; the power space 210 is used to configure the power supplies, and the system space 220 is used to configure the devices and components required by the system except for the power supplies.

In the present disclosure, the at least one open-frame power supply 10, 20 is disposed away from a first opening 211 of the power space 210. For example, since the first power supply 10 and the second power supply 20 are laterally disposed side by side inside the power space 210, in one embodiment, the second power supply 20 is an open-frame power supply, and is disposed away from the first opening 211 of the power space 210; the first power supply 10 is an enclosure power supply, and is disposed near to the first opening 211 of the power space 210. In another embodiment, the first power supply 10 and the second power supply 20 are both open-frame power supplies.

As shown in FIG. 1 and FIG. 2, the power supply device further includes a tray 30. The tray is used to carry the at least two power supplies 10, 20 thereon. In other words, the first power supply 10 and the second power supply 20 are laterally disposed side by side on the tray 30 and inside the power space 210. Specifically, the tray 30 includes a handle 31, and therefore the user can push and pull the tray 30 (move the tray 30 in and out) by operating the handle 31 to install or remove any one of the at least two power supplies 10, 20.

Figure 3:
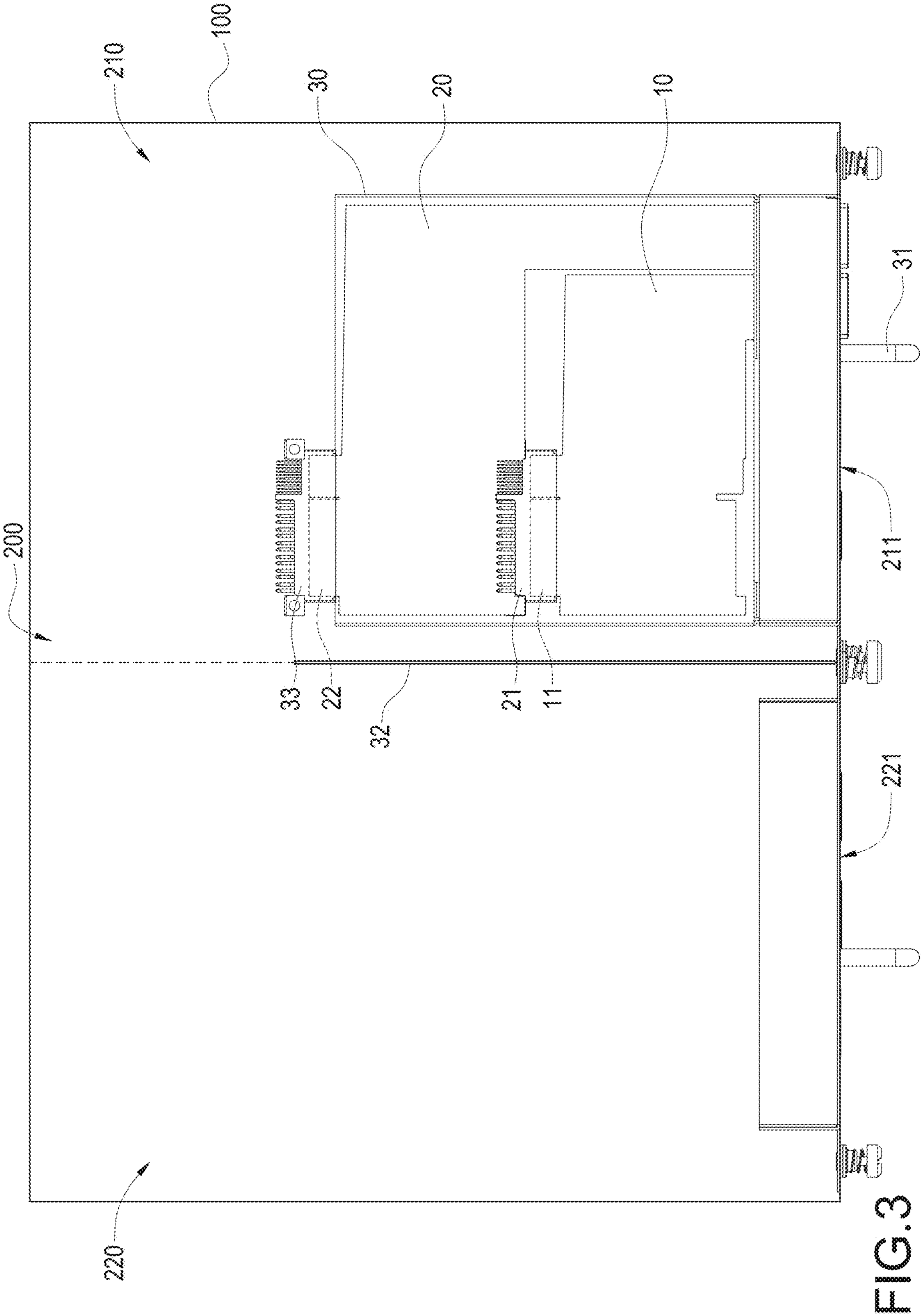
FIG. 3 is a top view of the power supply device according to a second embodiment of the present disclosure.

As shown in FIG. 1 and FIG. 3, the power supply device further includes a first cooling fan 41 and a second cooling fan 42. The first cooling fan 41 is laterally disposed in the first opening 211 of the power space 210, and the second cooling fan 42 is laterally disposed in a second opening 221 of the system space 220. However, the arrangement manner of the first cooling fan 41 and the second cooling fan 42 is not limited to the manner shown in FIG. 2, that is, as long as it can provide good heat dissipation effect, it can be adopted by the present disclosure. In particular, the first cooling fan 41 and the second cooling fan 42 evacuate the heat generated in the power space 210 and the system space 220 to the outside by extracting or inhaling air.

As shown in FIG. 1 and FIG. 2, the tray 30 further includes at least one partition 32, and the at least one partition 32 is disposed on one side of the tray 30. In other words, the at least one partition 32 is integrally formed with the tray 30. As shown in FIG. 1 and FIG. 2, the at least one partition 32 is formed on the side of the tray 30 adjacent to the system space 220. Furthermore, the at least one partition 32 includes an opening 321, and the size and/or the position of the opening 321 are adjustable. In this embodiment, therefore, the at least one partition 32 may not have only one opening, but may also have multiple openings. Accordingly, by adjusting the size of the opening 321, the flow speed and flow amount of the airflow in the power space 210 and the system space 220 can be effectively managed to achieve optimal heat dissipation efficiency. In one embodiment, the opening 321 is optionally provided, that is, when the partition 32 is provided without the opening 321, the airflow of the power space 210 and the system space 220 may be managed independently of each other so that the heat generated by the heat source in the power space 210 and the heat generated by the heat source in the system space 220 are taken away to the outside through the first cooling fan 41 and the second cooling fan 42 respectively.

If the partition 32 is provided with the opening 321, the airflow of the power space 210 and the system space 220 may be managed interdependently so that the heat generated by the heat source in the power space 210 can be taken away to the outside through the first cooling fan 41 and/or the second cooling fan 42. Similarly, the heat generated by the heat source in the system space 220 can be taken away to the outside through the second cooling fan 42 and/or the first cooling fan 41. For example, when the partition 32 is provided with the opening 321, if the second cooling fan 42 is in a failure state and cannot operate, the heat generated by the heat source in the system pace 220 (and/or the heat generated by the heat source in the power space 210) can be removed through the first cooling fan 41, thereby preventing the heat generated by the heat source in the system space 220 from accumulating, causing the high temperature to easily cause damage to the equipment and damage to components. Similarly, if the first cooling fan 41 is in a failure state and cannot operate, the heat generated by the heat source in the power pace 210 (and/or the heat generated by the heat source in the system space 220) can be removed through the second cooling fan 42, thereby preventing the heat generated by the heat source in the power space 210 from accumulating, causing the high temperature to easily cause damage to the equipment and damage to components.

Please refer to FIG. 3, which shows a top view of the power supply device according to a second embodiment of the present disclosure. Compared with FIG. 2, in the embodiment of FIG. 3, the power supply device also provides a partition 32, but the partition 32 is not integrally formed with the tray 30, that is, the partition 32 is independently disposed between the power space 210 and the system space 220. Specifically, the partition 32 is longitudinally disposed between the power space 210 and the system space 220. In particular, the partition 32 includes an opening 321, and the size and the position of the opening 321 are adjustable. For the description of the partition 32, please refer to the contents related to FIG. 1 and FIG. 2, and will not be repeated here.

In the present disclosure, one of the at least two power supplies 10, 20 includes a DC-to-DC conversion unit 96, which is disposed at the rear of a series-connected power path of the power supply device, for converting an external voltage Vin into a DC supply voltage Vout to a system. In particular, the DC-to-DC conversion unit 96 is disposed on the second power supply 20 away from the first opening 211. In one embodiment, if the second power supply 20 is the open-frame power supply and the first power supply 10 is the enclosure power supply, the DC-to-DC conversion unit 96 is disposed on the second power supply 20. In another embodiment, if the both first power supply 10 and the second power supply 20 are open-frame power supplies, the DC-to-DC conversion unit 96 is disposed on the second power supply 20.

Figure 4:
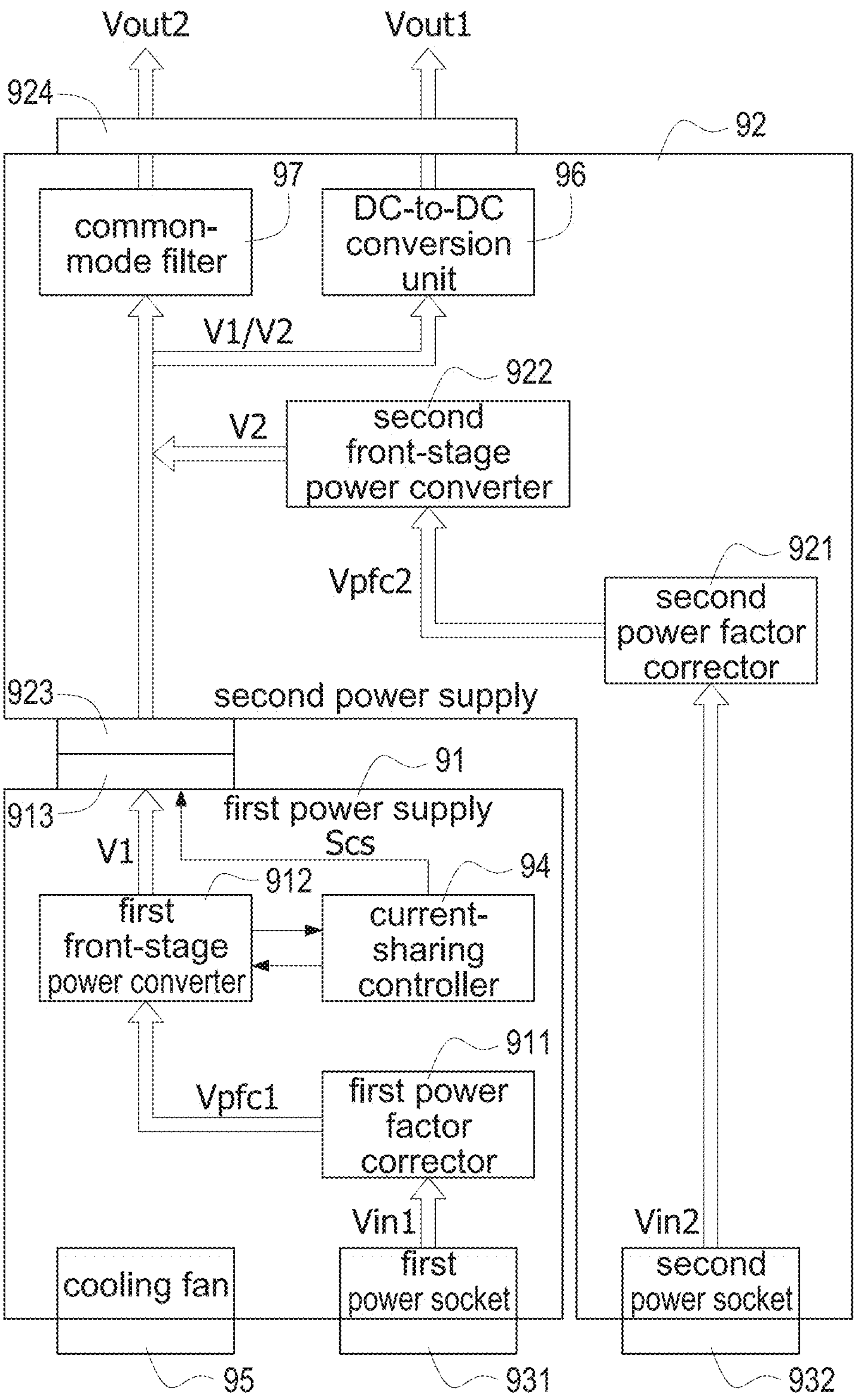
FIG. 4 is a block diagram of two power supplies according to a first embodiment of the present disclosure.
Figure 5:
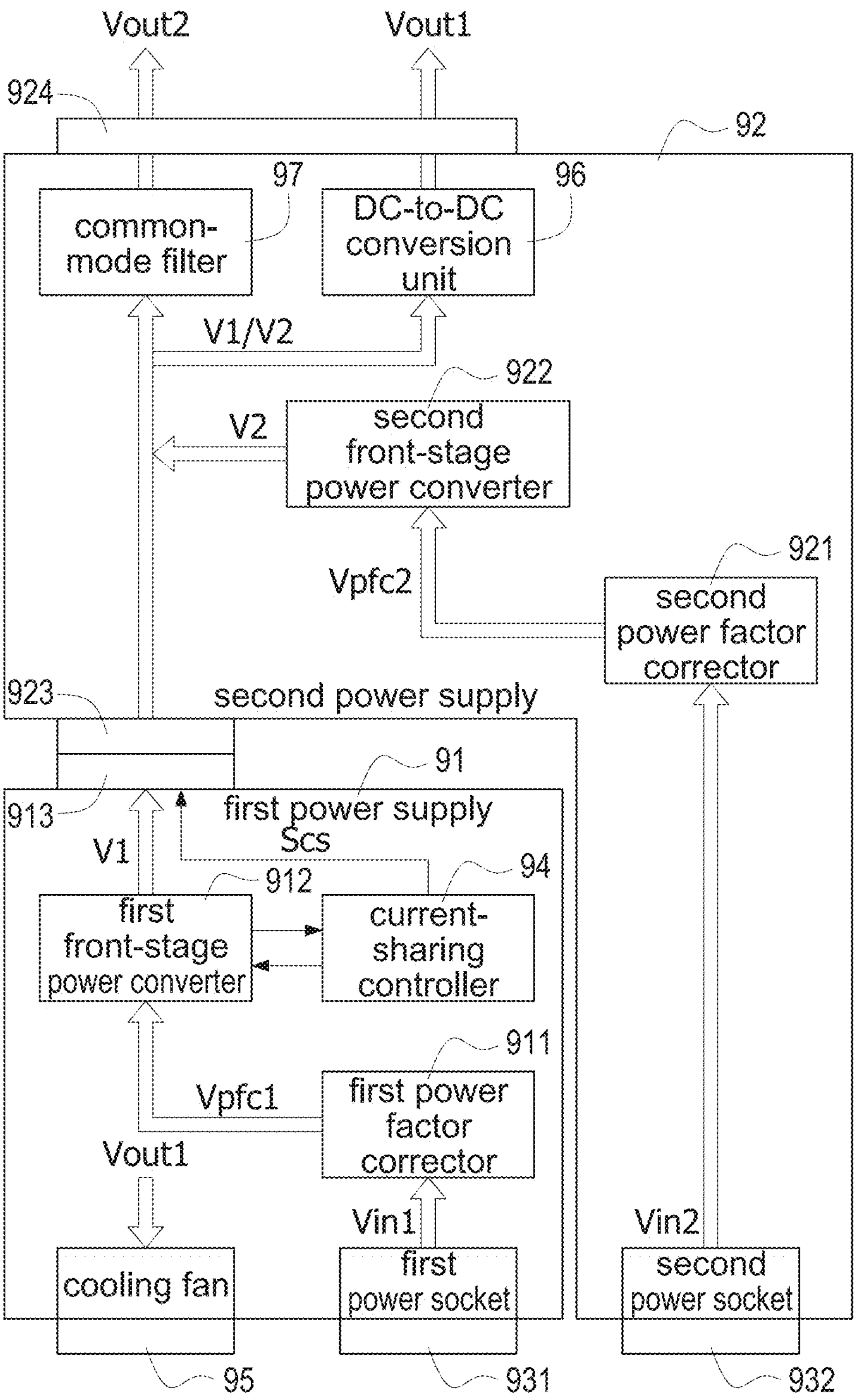
FIG. 5 is a block diagram of two power supplies according to a second embodiment of the present disclosure.
Figure 6:
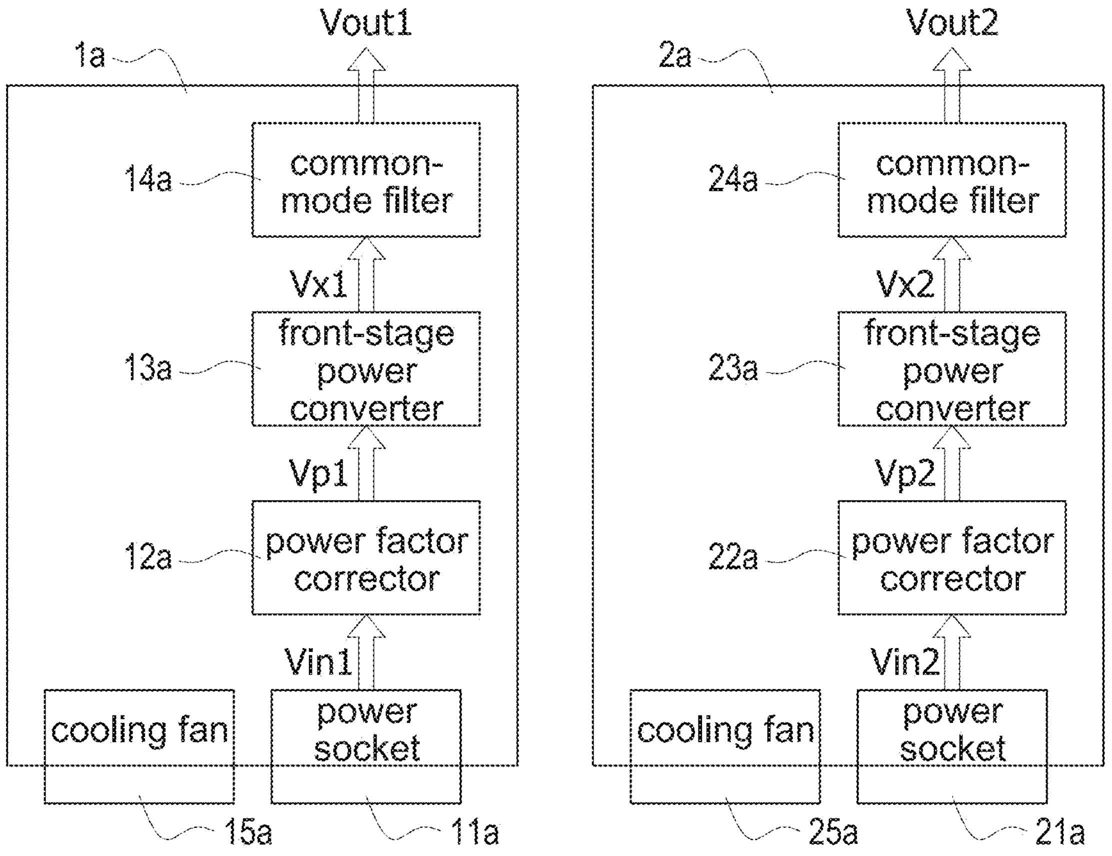
FIG.6 (related art)
FIG. 6 is a block diagram of two enclosure power supplies of the related art.

Please refer to FIG. 4 and FIG. 5, which respectively show a block diagram of two power supplies according to a first embodiment and a second embodiment of the present disclosure. For convenience of explanation, only two power supplies are taken as an example, and the second power supply 92 is an open-frame power supply, and the first power supply 91 is an enclosure power supply. The second power supply 92 is disposed away from the first opening 211 of the power space 210, and the first power supply 10 is disposed near to the first opening 211 of the power space 210.

The first power supply 91 includes a first power factor corrector 911, a first front-stage power converter 912, a current-sharing controller 94, a first connection unit 913, and a first power socket 931 provided thereon. The second power supply 92 includes a second power factor corrector 921, a second front-stage power converter 922, a DC-to-DC conversion unit 96, a common-mode filter 97, a second connection unit 923, and a second power socket 932 provided thereon. In particular, the first power supply 91 and the second power supply 92 are connected in series to each other by the connection between the first connection unit 913 and the second connection unit 923.

The first power socket 931 of the first power supply 91 receives a first external voltage Vin1, for example, but not limited to an AC voltage of 110 volts. The first power factor corrector 911 performs an AC-to-DC conversion to the first external voltage Vin1 to generate a first conversion voltage Vpfc1. The first conversion voltage Vpfc1 is provide to the first front-stage power converter 912, and the first conversion voltage Vpfc1 is converted by the first front-stage power converter 912 to generate a first voltage V1, for example, but not limited to, a DC voltage of 54.5 volts. The first voltage V1 is transmitted to the second power supply 92 through the first connection unit 913.

The second power supply 92 receives the first voltage V1 through the second connection unit 923, and transmits the received first voltage V1 to the common-mode filter 97 to generate a second output voltage Vout2, for example, but not limited to, a DC voltage of 54.5 volts.

The second output voltage Vout2 is transmitted to a system equipment, such as a PoE power supplying equipment, through a third connection unit 924 for supplying power required to the system equipment. Alternatively, the first voltage V1 may be converted by the DC-to-DC conversion unit 96 to a first output voltage Vout1, for example, but not limited to, one of 12 volts, 9 volts, 5 volts, and 3.3 volts for supplying power required to system components, such as CPU.

In addition, since the second power supply 92 is the open-frame power supply in this embodiment, the second power socket 932 is disposed on the same plane as the handle 31 of the tray 30 for receiving a second external voltage Vin2, for example, but not limited to an AC voltage of 110 volts, and the second external voltage Vin2 is provided to the second power supply 92. The second power supply 92 may be electrically connected to the second power socket 932 using a cable or electrical connector. The second power factor corrector 921 receives the second external voltage Vin2, and performs an AC-to-DC conversion to generate a second conversion voltage Vpfc2. The second conversion voltage Vpfc2 is provide to the second front-stage power converter 922, and the second conversion voltage Vpfc2 is converted by the second front-stage power converter 922 to generate a second voltage V1, for example, but not limited to, a DC voltage of 54.5 volts. The second voltage V2 may be transmitted to the common-mode filter 97 to generate the second output voltage Vout2, for example, but not limited to, a DC voltage of 54.5 volts. The second output voltage Vout2 is transmitted to the system equipment, such as a PoE power supplying equipment, through the third connection unit 924 for supplying power required to the system equipment. Alternatively, the second voltage V2 may be converted by the DC-to-DC conversion unit 96 to the first output voltage Vout1, for example, but not limited to, one of 12 volts, 9 volts, 5 volts, and 3.3 volts, and the first output voltage Vout1 is transmitted to system components through the third connection unit 924 for supplying power required to system components, such as CPU.

In the present disclosure, one of the at least two power supplies 91, 92 includes the current-sharing controller 94. The current-sharing controller 94 may be a microcontroller (MCU). After the at least two power supplies 91, 92 mutually communicate through the first connection unit 913 and the second connection unit 923, the at least two power supplies 91, 92 respectively output current required by the system. In particular, when some components of the second power supply 92 fail, such as the second power factor corrector 921 and/or the second front-stage power converter 922 fail, since the second power supply 92 is electrically connected to the first power supply 91 through the second connection unit 923, the microcontroller (MCU) controls the first power supply 91 to output the current required by the system and directly transmit to the common-mode filter 97 and the DC-to-DC conversion unit 96. Therefore, when the second power supply 92 fails, the first power supply 91 can provide sufficient power to the system through the bypass path. Accordingly, the series structure of the present disclosure can achieve the current sharing and backup mechanisms of the conventional parallel redundant power supply modules, and has the advantage of simplifying the circuit structure compared to the conventional parallel structure.

In addition, in FIG. 4, although the current-sharing controller 94 is disposed in the first power supply 91, the current-sharing controller 94 may also be disposed in the second power supply 92 so that the output current-sharing control of the at least two power supplies 91, 92 can also be realized through the proportional current sharing.

In addition, one of the at least two power supplies 91, 92 includes the common-mode filter 97, and the common-mode filter 97 is shared (commonly used) by the at least two power supplies 91, 92. In the embodiment shown in FIG. 4, the common-mode filter 97 is disposed at the rear of a series-connected power path of the power supply device, and therefore the common-mode filter 97 is disposed in the second power supply 92.

Compared with FIG. 4, the embodiment shown in FIG. 5 is to illustrate that the cooling fan configured on the first power supply 91 can be supplied power for its normal operation by the first output voltage Vout1 outputted by the second power supply 92.

In summary, the present disclosure has the following features and advantages:

1. The power supply close to the system is set as an open-frame power supply and designed as a series-connected structure, which can save the use of connectors on the system side.
2. Due to the series-connected structure design, the two power supplies can share one common-mode filter to save cost and space.
3. Due to the series-connected structure design, the system side can save the required additional filter circuit and space so that the extra space can be used to increase the power of the open-frame power supply.
4. Due to the series-connected structure design, the active current-sharing control circuit can be omitted.
5. By adjusting the size of the opening(s) of the partition, the airflow in the power space and the system space can be effectively managed to achieve the optimal cooling efficiency.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. A power supply device installed inside a casing having an accommodation space, the power supply device comprising:

at least two power supplies disposed inside the accommodation space comprising a power space and a system space, wherein at least one of the at least two power supplies is an open-frame power supply; each of the at least two power supplies comprises a connection unit, and the at least two power supplies are connected in series through the connection units;

at least one partition disposed between the power space and the system space, the at least two power supplies being laterally disposed inside the power space; and at least one opening formed on each of the at least one partition and aligned with the open-frame power supply, wherein a size of the at least one opening is adjustable and the at least one opening is configured to be regulated to guide a specific volume of airflow in the power space and the system space.

2. The power supply device as claimed in claim 1, wherein the at least one open-frame power supply is disposed away from a first opening of the power space.

3. The power supply device as claimed in claim 1, further comprising:

a tray configured to carry the at least two power supplies thereon, wherein the tray comprises a handle, and the handle is configured to push and pull the tray in the accommodation space so as to replace any one of the at least two power supplies.

4. The power supply device as claimed in claim 3, wherein the tray further comprises:

the at least one partition disposed on one side of the tray.

5. The power supply device as claimed in claim 1, wherein the open-flame power supply is disposed away from a first opening of the power space.

6. The power supply device as claimed in claim 2, further comprising:

a first cooling fan laterally disposed in the first opening of the power space.

7. The power supply device as claimed in claim 2, further comprising:

a second cooling fan laterally disposed in a second opening of the system space.

8. The power supply device as claimed in claim 1, wherein the connection unit is a gold finger connector or a wire-to-board connector.

9. The power supply device as claimed in claim 1, wherein one of the at least two power supplies comprises a DC-to-DC conversion unit, and the DC-to-DC conversion unit is configured to convert an external voltage to generate a DC supply voltage to a system.

10. The power supply device as claimed in claim 9, wherein the DC-to-DC conversion unit is disposed on the open-frame power supply.

11. The power supply device as claimed in claim 9, wherein the DC supply voltage is one of 12 volts, 9 volts, 5 volts, and 3.3 volts.

12. The power supply device as claimed in claim 1, wherein one of the at least two power supplies comprises a current-sharing controller, and the current-sharing controller is configured to realize an output current-sharing control of the at least two power supplies through a proportional current sharing.

13. The power supply device as claimed in claim 1, wherein one of the at least two power supplies comprises a common-mode filter, and the common-mode filter is shared by the at least two power supplies.

14. The power supply device as claimed in claim 13, wherein the common-mode filter is disposed in one of the at least one power supply.

* * * * *